US012805280B2

(12) United States Patent
Lee et al.

(10) Patent No.: US 12,805,280 B2
(45) Date of Patent: Nov. 17, 2026

(54) SEMICONDUCTOR STRUCTURE

(71) Applicant: Taiwan Semiconductor Manufacturing Company, Ltd., Hsinchu (TW)

(72) Inventors: Cheng-Chin Lee, Hsinchu (TW); Yen Ju Wu, Hsinchu (TW); Shao-Kuan Lee, Hsinchu (TW); Kuang-Wei Yang, Hsinchu (TW); Hsin-Yen Huang, Hsinchu (TW); Jing Ting Su, Hsinchu (TW); Kai-Fang Cheng, Hsinchu (TW); Hsiao-Kang Chang, Hsinchu (TW); Wei-Chen Chu, Hsinchu (TW); Shu-Yun Ku, Hsinchu (TW); Chia-Tien Wu, Hsinchu (TW); Ming-Han Lee, Hsinchu (TW); Hsin-Ping Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 439 days.

(21) Appl. No.: 18/374,279

(22) Filed: Sep. 28, 2023

(65) Prior Publication Data

US 2025/0112088 A1 Apr. 3, 2025

(51) Int. Cl.

| | |
|---|---|
| ***H10W 20/00*** | (2026.01) |
| ***H10W 20/41*** | (2026.01) |
| ***H10W 20/42*** | (2026.01) |

(52) U.S. Cl.

CPC ....... *H10W 20/075* (2026.01); *H10W 20/033* (2026.01); *H10W 20/42* (2026.01); *H10W 20/425* (2026.01)

(58) Field of Classification Search

CPC ......... H01L 23/5226; H01L 23/53295; H10W 20/075; H10W 20/42; H10W 20/069; H10W 20/0693; H10W 20/47

See application file for complete search history.

(56) References Cited

U.S. PATENT DOCUMENTS

| | | | | |
|---|---|---|---|---|
| 2022/0285210 | A1* | 9/2022 | Lin | H01L 21/76813 |
| 2023/0120199 | A1* | 4/2023 | Motoyama | H01L 23/5226 438/687 |
| 2024/0096797 | A1* | 3/2024 | Kang | H01L 21/76832 |

FOREIGN PATENT DOCUMENTS

| | | | |
|---|---|---|---|
| CN | 107026087 | * | 8/2017 |

OTHER PUBLICATIONS

Lee et al., "Interconnection Structure and Methods of Forming the Same", U.S. Appl. No. 18/207,875, dated Jun. 9, 2023, 58 pages.

* cited by examiner

*Primary Examiner* — Matthew L Reames

(74) *Attorney, Agent, or Firm* — Birch, Stewart, Kolasch & Birch, LLP

(57) ABSTRACT

A semiconductor structure is provided. The semiconductor structure includes a first low dielectric constant (low-k) layer, a first metal layer, a metal cap layer, a dielectric on dielectric (DoD) layer, an etch stop layer (ESL), a second low-k layer, a metal via and a second metal layer. The dielectric constant of the first low-k layer is less than 4. The first metal layer is embodied in the first low-k layer. The first low-k layer exposes the first metal layer. The metal cap layer is disposed on the first metal layer. The DoD layer is disposed on the first low-k layer. The etch stop layer is disposed on the metal cap layer and the DoD layer. The second low-k layer is disposed above the etch stop layer. The metal via is embodied in the second low-k layer and connected to the first metal layer.

20 Claims, 13 Drawing Sheets

SEMICONDUCTOR STRUCTURE

BACKGROUND

The disclosure relates in general to a semiconductor structure, and more particularly to a semiconductor structure with a metal via.

Moore's law has been the most powerful driver for the development of the microelectronic industry. In terms of energy, interconnects have always accounted for more than half of the capacitance on a chip; hence, have dissipated more than 50% of the dynamic power on a chip. Resistance & Capacitance are issues in scaling damascene BEOL.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
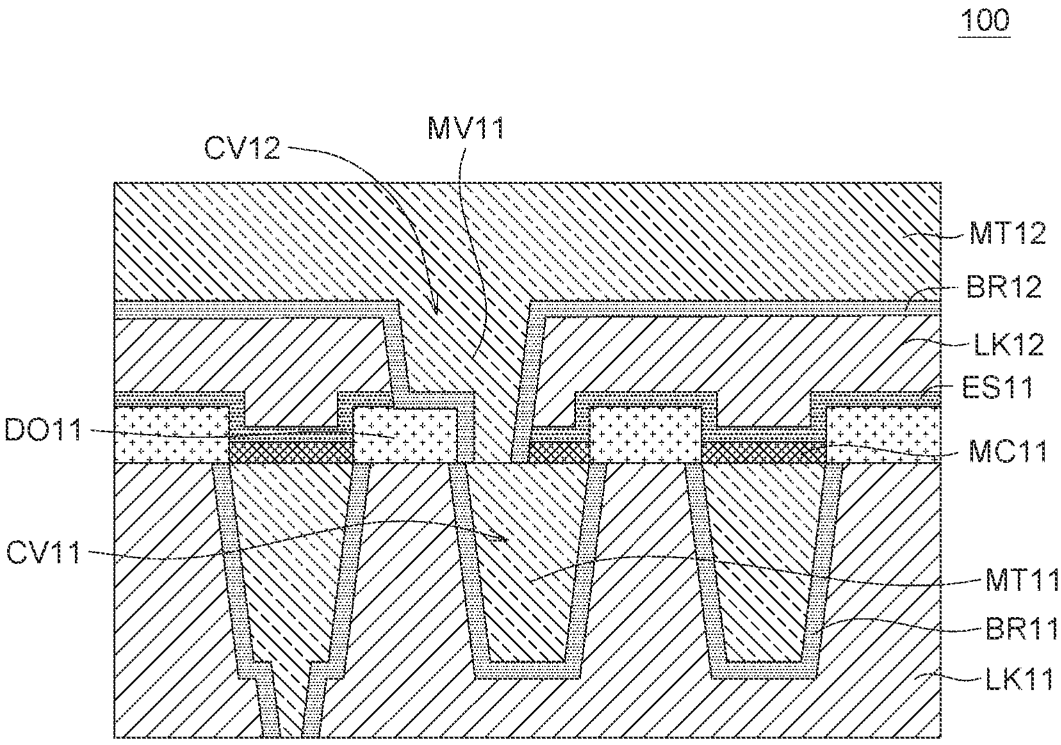
FIG. 1 shows a semiconductor structure according to one embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for case of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Please refer to FIG. 1, which shows a semiconductor structure 100 according to one embodiment. The semiconductor structure 100 is, for example, used to connect a first metal layer (or called Mx metal layer) MT11 and a second metal layer (or called Mx+1 metal layer) MT12 in the back-end-of-line (BEOL) process. The semiconductor structure 100 includes a first low dielectric constant (low-k) layer LK11, the first metal layer MT11, a first barrier layer BR11, a metal cap layer MC11, a dielectric on dielectric (DoD) layer DO11, an etch stop layer (ESL) ES11, a second low-k layer LK12, a second barrier layer BR12, a metal via MV11 and the second metal layer MT12.

The dielectric constant of the first low-k layer LK11 is less than 4. The material of the first low-k layer LK11 is, for example, silicon oxide ($SiO2$), silicon oxynitride (SiON), silicon nitride ($Si3N4$), silicon oxycarbide (SiOC), silicon oxycarbonitride (SiOCN), the like, or a combination thereof.

The first metal layer MT11 is embodied in the first low-k layer LK11. The first low-k layer LK11 has a concave CV11 and the first metal layer MT11 is disposed in the concave CV11. The first low-k layer LK11 exposes the first metal layer MT11. The material of the first metal layer MT11 is, for example, tungsten (W), ruthenium (Ru), cobalt (Co), copper (Cu), aluminum (Al), nickel (Ni), gold (Au), silver (Ag), gold-aluminum (AuAl), molybdenum (Mo), the like, or a combination thereof.

The first barrier layer BR11 is disposed on the sidewall of the concave CV11 and the bottom of the concave CV11. The first barrier layer BR11 is disposed between the first metal layer MT11 and the first low-k layer LK11. The material of the first barrier layer BR11 is, for example, titanium nitride (TiN), tantalum nitride (TaN) or silicon nitride (SiN), the like, or a combination thereof.

The metal cap layer MC11 is disposed on the first metal layer MT11 and is not disposed on the first low-k layer LK11. That is, the metal cap layer MC11 only covers the first metal layer MT11. The material of the metal cap layer MC11 is, for example, cobalt (Co), graphene, nickel (Ni), tin (SN), tin-lead (Sn—Pb), gold (Au), copper (Cu), silver (Ag), palladium (Pd), indium (In), nickel-palladium-gold (Ni—Pd—Au), nickel-gold (Ni—Au), the like, or a combination thereof.

The DoD layer DO11 is disposed on the first low-k layer LK11 and is not disposed on the metal cap layer MC11. That is, the DoD layer DO11 only covers part of the first low-k layer LK11 exposed by the first metal layer MT11. The thickness of the DoD layer is, for example, less than 15 Å. The thickness of the DoD layer DO11 is larger than the thickness of the metal cap layer MC11. For example, the DoD layer DO11 is 2 to 5 times thicker than the metal cap layer MC11. The DoD layer DO11 protrudes from the metal cap layer MC11. The material of the DoD layer DO11 is, for example, aluminum nitride (AlN), aluminum oxynitride (AlON), aluminum oxide (AlO) whose dielectric constant is larger than 7, silicon oxide (SiOx) whose dielectric constant is about 4, aluminum oxycarbide (AlOC) whose dielectric constant is about 5.

The etch stop layer (ESL) ES11 is disposed on the metal cap layer MC11 and the DoD layer DO11. The etch stop layer ES11 covers the top surface of the metal cap layer MC11, the lateral surface and the top surface of the DoD layer DO11. In the embodiment of the FIG. 1, the etch stop layer ES11 is a single-layer structure having low capacitance, low-k and moisture blocking properties. The material of the etch stop layer ES11 is, for example, silicon carbon nitride (SiCxNy), boron nitride (BN), boron carbonitride (BCN), silicon oxycarbonitride (SiOCN), silicon oxycarbide (SiOC), the like, or a combination thereof.

The second low-k layer LK12 is disposed above the etch stop layer ES11. The material of the second low-k layer LK12 is, for example, silicon oxide (SiO2), silicon oxynitride (SiON), silicon nitride (Si3N4), silicon oxycarbide (SiOC), silicon oxycarbonitride (SiOCN), the like, or a combination thereof. The material of the second low-k layer LK12 and the material of the first low-k layer LK11 may be the same or different.

The metal via MV11 is embodied in the second low-k layer LK12 and connected to the first metal layer MT11. The second low-k layer LK12 has a concave CV12 and the metal via MV11 is disposed in the concave CV12. The material of the metal via MV11 is, for example, tungsten (W), ruthenium (Ru), cobalt (Co), copper (Cu), aluminum (Al), nickel (Ni), gold (Au), silver (Ag), gold-aluminum (AuAl), molybdenum (Mo), the like, or a combination thereof.

The second metal layer MT12 is disposed above the second low-k layer LK12 and connected to the metal via MV11. The second metal layer MT12 is disposed on the second barrier layer BR12 and the metal via MV11. The material of the second metal layer MT12 is, for example, tungsten (W), ruthenium (Ru), cobalt (Co), copper (Cu), aluminum (Al), nickel (Ni), gold (Au), silver (Ag), gold-aluminum (AuAl), molybdenum (Mo), the like, or a combination thereof. The material of the second metal layer MT12, the material of the metal via MV11 and the material of the first metal layer MT11 may be the same or different.

The second barrier layer BR12 is disposed at the top surface of the second low-k layer LK12 and the sidewall of the concave CV12. The second barrier layer BR12 is disposed between the second metal layer MT12 and the second low-k layer LK12, between the metal via MV11 and the second low-k layer LK12, between the metal via MV11 and the DoD layer DO11, and between the metal via MV11 and the metal cap layer MC11. The material of the second barrier layer BR12 is, for example, titanium nitride (TiN), tantalum nitride (TaN) or silicon nitride (SiN), the like, or a combination thereof. The material of the second barrier layer BR12 and the material of the first barrier layer BR11 may be the same or different.

In this embodiment, the DoD layer DO11 could prevent punch caused by metal via MV11 landing misalignment. The punch will lead to line to line leakage fail, voltage breakdown (Vbd) and worse Time Dependent Dielectric Breakdown (TDDB).

Figure 2:
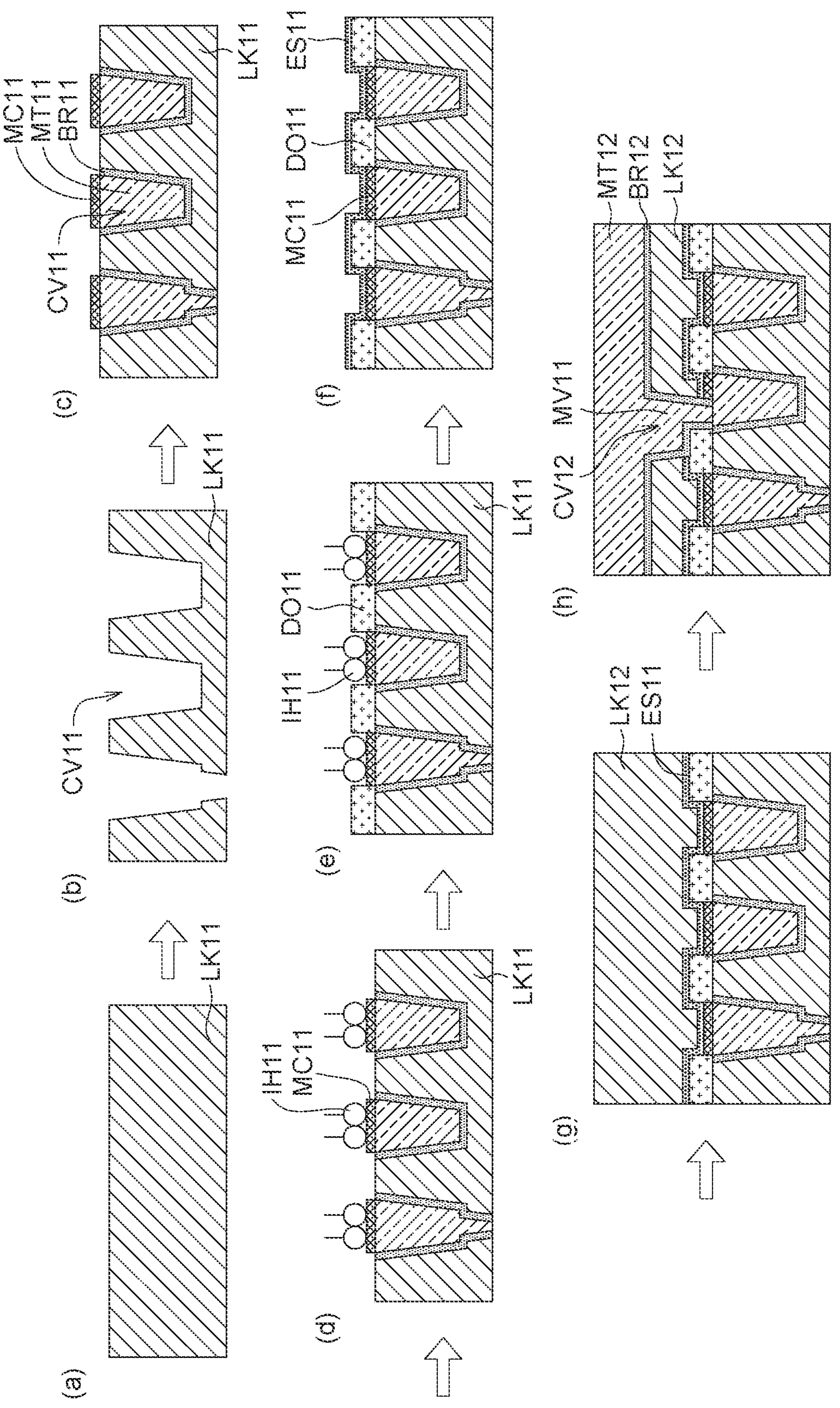
FIG. 2 shows a manufacturing method of the semiconductor structure of FIG. 1 according to one embodiment.

Please refer to FIG. 2, which shows a manufacturing method of the semiconductor structure 100 of FIG. 1 according to one embodiment. As shown in the drawing (a) of the FIG. 2, the first low-k layer LK11 is formed. In this step, the first low-k layer LK11 could be formed, for example, by spin coating, Plasma Enhanced Chemical Vapor Deposition (PECVD), Plasma Enhanced Atomic Layer Deposition (PEALD) or other suitable process. The precursor used for depositing the first low-k layer LK11 could be silane-based material or siloxane-based material with oxygen or non-oxygen process.

Then, as shown in the drawing (b) of the FIG. 2, the concave CV11 is formed in the first low-k layer LK11. In this step, the first low-k layer LK11 could be etched by wet etching, dry etching or other suitable process.

Next, as shown in the drawing (c) of the FIG. 2, the first barrier layer BR11, the first metal layer MT11 and the metal cap layer MC11 are formed.

The first barrier layer BR11 is formed on the bottom surface and the lateral surface of the concave CV11. The first barrier layer BR11 could be formed, for example, by Chemical Vapor Deposition (CVD), Physical Vapor Deposition (PVD), plating or other suitable processes.

The first metal layer MT11 is formed on the first barrier layer BR11 and in the concave CV11. The first metal layer MT11 could be formed, for example, by Electro Chemical Plating (ECP), Electroless Deposition (ELD), Chemical Vapor Deposition (CVD), Physical Vapor Deposition (PVD), plating or other suitable processes.

The metal cap layer MC11 is formed on the first metal layer MT11. The metal cap layer MC11 is only formed on the first metal layer MT11, and is not formed on the first low-k layer LK11. The metal cap layer MC11 could be formed, for example, by Chemical Vapor Deposition (CVD), Physical Vapor Deposition (PVD), plating or other suitable processes.

Afterwards, as shown in the drawing (d) of the FIG. 2, an inhibitor layer IH11 is formed on the metal cap layer MC11. The inhibitor layer IH11 only covers the metal cap layer MC11, and does not cover the first low-k layer LK11. The material of the inhibitor layer IH11 is thiol (—SH) material, phosphonic acid (—POOH) material, benzoate self assembly monolayer (SAM) and other specific functional group that could attach to metal but not on the low-k material. In this step, the inhibitor layer IH11 could be formed, for example, by Chemical Vapor Deposition (CVD), spin coating, spraying, or dip coating.

Next, as shown in the drawing (e) of the FIG. 2, the DoD layer DO11 is formed on the first low-k layer LK11 without covering the inhibitor layer IH11. In this step, the DoD layer DO11 could be deposited, for example, by thermal Atomic Layer Deposition (ALD) to prevent the inhibitor layer IH11 being damaged during the deposition of the DoD layer DO11.

Then, as shown in the drawing (f) of the FIG. 2, the etch stop layer ES11 is formed on the metal cap layer MC11 and the DoD layer DO11. In this step, the etch stop layer ES11 is formed, for example, by Plasma Enhanced Chemical Vapor Deposition (PECVD), Plasma Enhanced Atomic Layer Deposition (PEALD), spin coating, remote plasma Chemical Vapor Deposition (CVD), remote plasma Physical Vapor Deposition (PVD) or other suitable process. The etch stop layer ES11 could be, for example, deposited by single precursor with silicon and nitrogen component, such as hexamethyldisilazane (HMDS), or dual precursor with silane and NH3. The inhibitor layer IH11 could be removed simultaneously during the plasma pretreat and the deposition of the etch stop layer ES11.

Afterwards, as shown in the drawing (g) of the FIG. 2, the second low-k layer LK12 is formed on the etch stop layer ES11. In this step, the second low-k layer LK12 could be formed, for example, by spin coating, Plasma Enhanced Chemical Vapor Deposition (PECVD), Plasma Enhanced Atomic Layer Deposition (PEALD) or other suitable process. The precursor used for depositing the second low-k layer LK12 could be silane-based material or siloxane-based material with oxygen or non-oxygen process.

Then, as shown in the drawing (h) of the FIG. 2, the concave CV12 is formed in the second low-k layer LK12 and the second barrier layer BR12, the metal via MV11 and the second metal layer MT12 are formed. In this step, the second low-k layer LK12 could be etched by wet etching, dry etching or other suitable process to form the concave CV12.

The second barrier layer BR12 is formed at the lateral surface of the concave CV12 and the top surface of the second low-k layer LK12. The second barrier layer BR12 could be formed, for example, by Chemical Vapor Deposition (CVD), Physical Vapor Deposition (PVD), plating or other suitable processes.

The metal via MV11 is formed on the second barrier layer BR12 and in the concave CV12. The metal via MV11 could be formed, for example, by Electro Chemical Plating (ECP), Electroless Deposition (ELD), Chemical Vapor Deposition (CVD), Physical Vapor Deposition (PVD), plating or other suitable processes.

The second metal layer MT12 is formed on the second barrier layer BR12 and in the concave CV12. The second metal layer MT12 could be formed, for example, by Electro Chemical Plating (ECP), Electroless Deposition (ELD), Chemical Vapor Deposition (CVD), Physical Vapor Deposition (PVD), plating or other suitable processes.

As shown in the drawing (h) of the FIG. 2, even if the landing misalignment is happened on the metal via MV11, the DoD layer DO11 will prevent punch. Therefore, line to line leakage fail and voltage breakdown (Vbd) can be prevented, and the Time Dependent Dielectric Breakdown (TDDB) can be improved.

Figure 3:
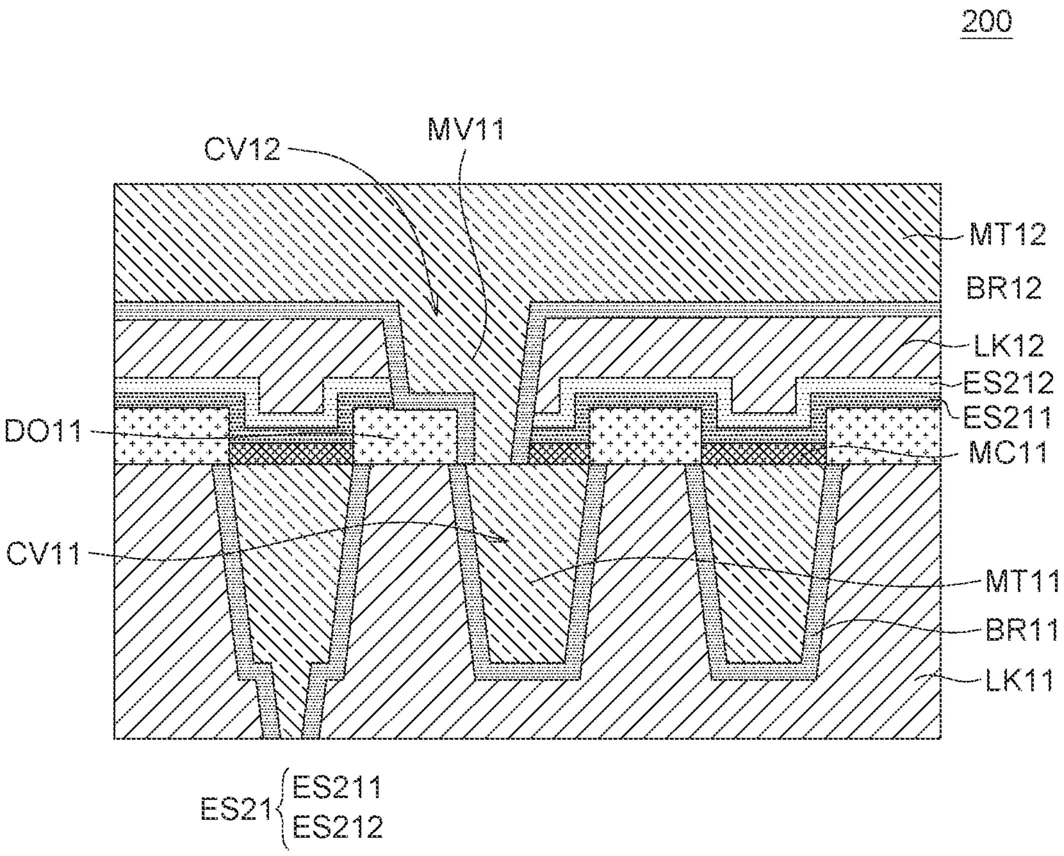
FIG. 3 shows a semiconductor structure according to another embodiment.

Please refer to FIG. 3, which shows a semiconductor structure 200 according to another embodiment. The semiconductor structure 200 is, for example, used to connect the first metal layer (or called Mx metal layer) MT11 and the second metal layer (or called Mx+1 metal layer) MT12 in the back-end-of-line (BEOL) process. The semiconductor structure 200 includes the first low dielectric constant (low-k) layer LK11, the first metal layer MT11, the first barrier layer BR11, the metal cap layer MC11, the dielectric on dielectric (DoD) layer DO11, an etch stop layer (ESL) ES21, the second low-k layer LK12, the second barrier layer BR12, the metal via MV11 and the second metal layer MT12.

The difference between the semiconductor structure 200 and the semiconductor structure 100 is in that the etch stop layer ES21 is a bilayer structure including a first layer ES211 having low-k property and a second layer ES212 having moisture blocking property. The material of the etch stop layer ES21 is, for example, silicon carbon nitride (SiCxNy), boron nitride (BN), boron carbonitride (BCN), silicon oxycarbonitride (SiOCN), silicon oxycarbide (SiOC), the like, or a combination thereof. For example, the material of the first layer ES211 of the etch stop layer ES21 could be silicon carbon nitride (SiCxNy), boron nitride (BN), boron carbonitride (BCN), silicon oxycarbonitride (SiOCN), silicon oxycarbide (SiOC), and the material of the second layer ES212 of the etch stop layer ES21 could be silicon oxycarbide (SiOxCy).

Figure 4:
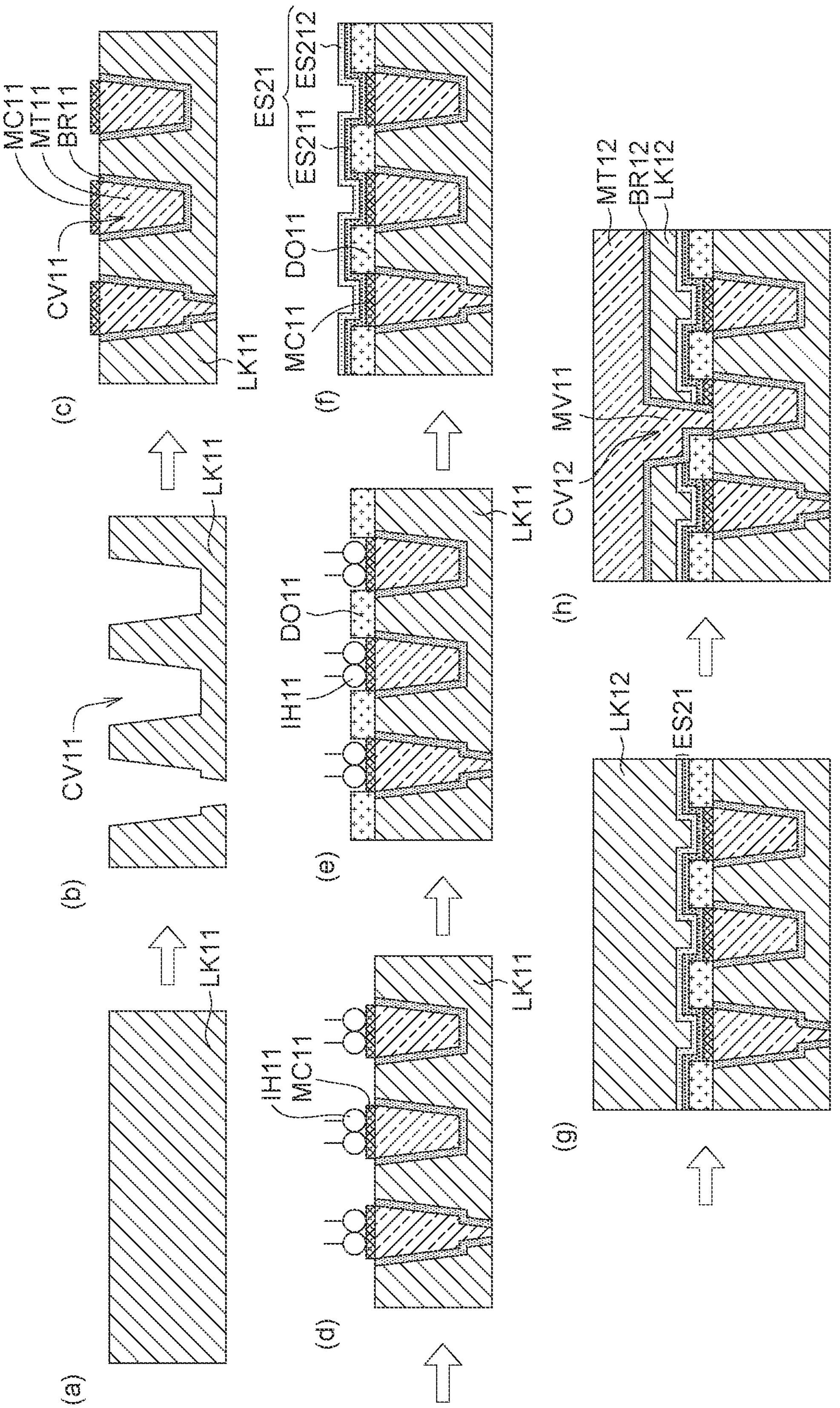
FIG. 4 shows a manufacturing method of the semiconductor structure of FIG. 3 according to one embodiment.

Please refer to FIG. 4, which shows a manufacturing method of the semiconductor structure 200 of FIG. 3 according to one embodiment. The difference between the manufacturing method of the semiconductor structure 200 and the manufacturing method of the semiconductor structure 100 is in the step illustrated in the drawing (f) of the FIG. 4.

As shown in the drawing (f) of the FIG. 4, the etch stop layer ES21 is formed on the metal cap layer MC11 and the DoD layer DO11. In this step, the first layer ES211 of the etch stop layer ES21 is formed, for example, by Plasma Enhanced Chemical Vapor Deposition (PECVD), Plasma Enhanced Atomic Layer Deposition (PEALD), spin coating, remote plasma Chemical Vapor Deposition (CVD), remote plasma Physical Vapor Deposition (PVD) or other suitable process. The first layer ES211 of the etch stop layer ES21 could be, for example, deposited by single precursor with silicon and nitrogen component, such as hexamethyldisilazane (HMDS), or dual precursor with silane and NH3. The inhibitor layer IH11 could be removed simultaneously during the plasma pretreat and the deposition of the first layer ES211 of the etch stop layer ES11.

The second layer ES212 of the etch stop layer ES21 is formed, for example, by Plasma Enhanced Chemical Vapor Deposition (PECVD), Plasma Enhanced Atomic Layer Deposition (PEALD), thermal Atomic Layer Deposition (ALD) or other suitable process.

Figure 5:
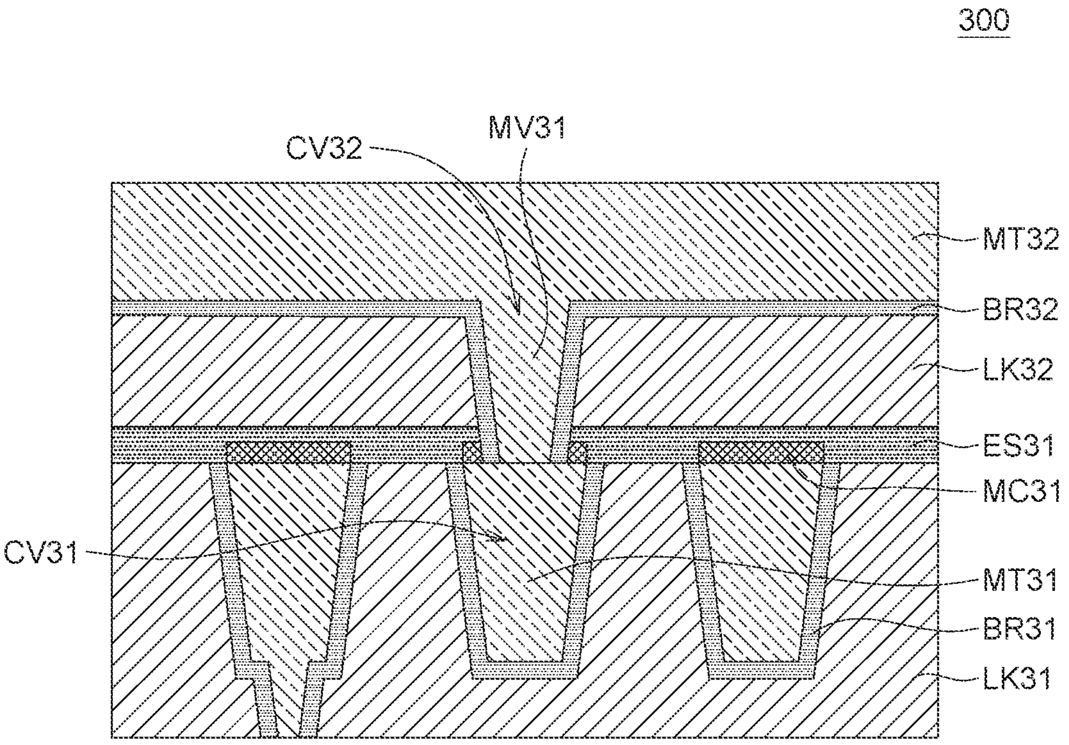
FIG. 5 shows a semiconductor structure according to another embodiment.

Please refer to FIG. 5, which shows a semiconductor structure 300 according to another embodiment. The semiconductor structure 300 is, for example, used to connect a first metal layer (or called Mx metal layer) MT31 and a second metal layer (or called Mx+1 metal layer) MT32 in the back-end-of-line (BEOL) process. The semiconductor structure 300 includes a first low dielectric constant (low-k) layer LK31, the first metal layer MT31, a first barrier layer BR31, a metal cap layer MC31, an etch stop layer (ESL) ES31, a second low-k layer LK32, a second barrier layer BR32, a metal via MV31 and the second metal layer MT32.

The dielectric constant of the first low-k layer LK31 is less than 4. The material of the first low-k layer LK31 is, for example, silicon oxide (SiO2), silicon oxynitride (SiON), silicon nitride (Si3N4), silicon oxycarbide (SiOC), silicon oxycarbonitride (SiOCN), the like, or a combination thereof.

The first metal layer MT31 is embodied in the first low-k layer LK31. The first low-k layer LK31 has a concave CV31 and the first metal layer MT31 is disposed in the concave CV31. The first low-k layer LK31 exposes the first metal layer MT31. The material of the first metal layer MT31 is, for example, tungsten (W), ruthenium (Ru), cobalt (Co), copper (Cu), aluminum (Al), nickel (Ni), gold (Au), silver (Ag), gold-aluminum (AuAl), molybdenum (Mo), the like, or a combination thereof.

The first barrier layer BR31 is disposed on the sidewall of the concave CV31 and the bottom of the concave CV31. The first barrier layer BR31 is disposed between the first metal layer MT31 and the first low-k layer LK31. The material of the first barrier layer BR31 is, for example, titanium nitride (TiN), tantalum nitride (TaN) or silicon nitride (SiN), the like, or a combination thereof.

The metal cap layer MC31 is disposed on the first metal layer MT31 and is not disposed on the first low-k layer LK31. That is, the metal cap layer MC31 only covers the first metal layer MT31. The material of the metal cap layer MC31 is, for example, cobalt (Co), graphene, nickel (Ni), tin (SN), tin-lead (Sn—Pb), gold (Au), copper (Cu), silver (Ag), palladium (Pd), indium (In), nickel-palladium-gold (Ni—Pd—Au), nickel-gold (Ni—Au), the like, or a combination thereof.

The etch stop layer (ESL) ES31 is disposed on the metal cap layer MC11 and part of the first low-k layer LK31. In the embodiment of the FIG. 5, the etch stop layer ES31 is a single-layer structure having low capacitance, low-k and moisture blocking properties. The material of the etch stop layer ES31 is a non-metal based material, such as silicon carbon nitride (SiCxNy), boron nitride (BN), boron carbonitride (BCN), silicon oxycarbonitride (SiOCN), silicon oxycarbide (SiOC), the like, or a combination thereof.

The second low-k layer LK32 is disposed above the etch stop layer ES31. The material of the second low-k layer LK32 is, for example, silicon oxide (SiO2), silicon oxynitride (SiON), silicon nitride (Si3N4), silicon oxycarbide (SiOC), silicon oxycarbonitride (SiOCN), the like, or a combination thereof. The material of the second low-k layer LK32 and the material of the first low-k layer LK31 may be the same or different.

The metal via MV31 is embodied in the second low-k layer LK32 and connected to the first metal layer MT31. The second low-k layer LK32 has a concave CV32 and the metal via MV31 is disposed in the concave CV32. The material of the metal via MV31 is, for example, tungsten (W), ruthenium (Ru), cobalt (Co), copper (Cu), aluminum (Al), nickel (Ni), gold (Au), silver (Ag), gold-aluminum (AuAl), molybdenum (Mo), the like, or a combination thereof.

The second metal layer MT32 is disposed above the second low-k layer LK32 and connected to the metal via MV31. The second metal layer MT32 is disposed on the second barrier layer BR32 and the metal via MV31. The material of the second metal layer MT32 is, for example, tungsten (W), ruthenium (Ru), cobalt (Co), copper (Cu), aluminum (Al), nickel (Ni), gold (Au), silver (Ag), gold-aluminum (AuAl), molybdenum (Mo), the like, or a combination thereof. The material of the second metal layer MT32, the material of the metal via MV31 and the material of the first metal layer MT31 may be the same or different.

The second barrier layer BR32 is disposed at the top surface of the second low-k layer LK32 and the sidewall of the concave CV32. The second barrier layer BR32 is disposed between the second metal layer MT32 and the second low-k layer LK32, between the metal via MV31 and the second low-k layer LK32, between the metal via MV31 and the etch stop layer ES31, and between the metal via MV31 and the metal cap layer MC31. The material of the second barrier layer BR32 is, for example, titanium nitride (TiN), tantalum nitride (TaN) or silicon nitride (SiN), the like, or a combination thereof. The material of the second barrier layer BR32 and the material of the first barrier layer BR31 may be the same or different.

In this embodiment, because the etch stop layer ES31 is the single-layer structure having low capacitance, low-k and moisture blocking properties, the etch stop layer ES31 could be prevent damage from the plasma deposition used to form the second layer. Therefore, the etch stop layer ES31 could lead to capacitance reduction about 5%.

Figure 6:
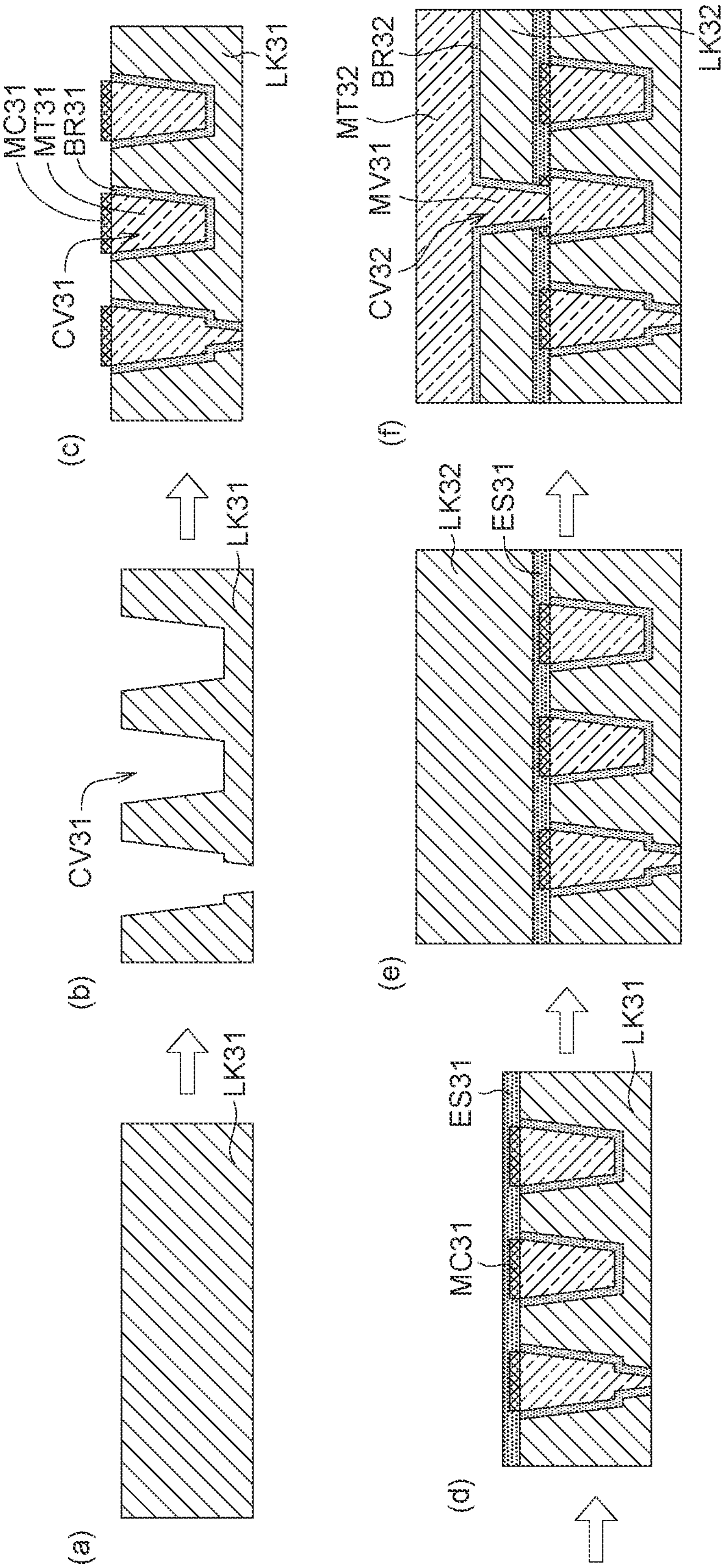
FIG. 6 shows a manufacturing method of the semiconductor structure of FIG. 5 according to one embodiment.

Please refer to FIG. 6, which shows a manufacturing method of the semiconductor structure 300 of FIG. 5 according to one embodiment. As shown in the drawing (a) of the FIG. 6, the first low-k layer LK31 is formed. In this step, the first low-k layer LK31 could be formed, for example, by spin coating, Plasma Enhanced Chemical Vapor Deposition (PECVD), Plasma Enhanced Atomic Layer Deposition (PEALD) or other suitable process. The precursor used for depositing the first low-k layer LK31 could be silane-based material or siloxane-based material with oxygen or non-oxygen process.

Then, as shown in the drawing (b) of the FIG. 6, the concave CV31 is formed in the first low-k layer LK31. In this step, the first low-k layer LK31 could be etched by wet etching, dry etching or other suitable process.

Next, as shown in the drawing (c) of the FIG. 6, the first barrier layer BR31, the first metal layer MT31 and the metal cap layer MC31 are formed.

The first barrier layer BR31 is formed on the bottom surface and the lateral surface of the concave CV31. The first barrier layer BR31 could be formed, for example, by Chemical Vapor Deposition (CVD), Physical Vapor Deposition (PVD), plating or other suitable processes.

The first metal layer MT31 is formed on the first barrier layer BR31 and in the concave CV31. The first metal layer MT31 could be formed, for example, by Electro Chemical Plating (ECP), Electroless Deposition (ELD), Chemical Vapor Deposition (CVD), Physical Vapor Deposition (PVD), plating or other suitable processes.

The metal cap layer MC31 is formed on the first metal layer MT31. The metal cap layer MC31 is only formed on the first metal layer MT31, and is not formed on the first low-k layer LK31. The metal cap layer MC31 could be formed, for example, by Chemical Vapor Deposition (CVD), Physical Vapor Deposition (PVD), plating or other suitable processes.

Then, as shown in the drawing (d) of the FIG. 6, the etch stop layer ES31 is formed on the metal cap layer MC31 and part of the first low-k layer LK31. In this step, the etch stop layer ES31 is formed, for example, by ALD like radical CVD (ARCVD) or other suitable process. The etch stop layer ES31 could be, for example, deposited by single precursor with silicon and nitrogen component, such as hexamethyldisilazane (HMDS), or dual precursor with silane and NH3.

Figure 7:
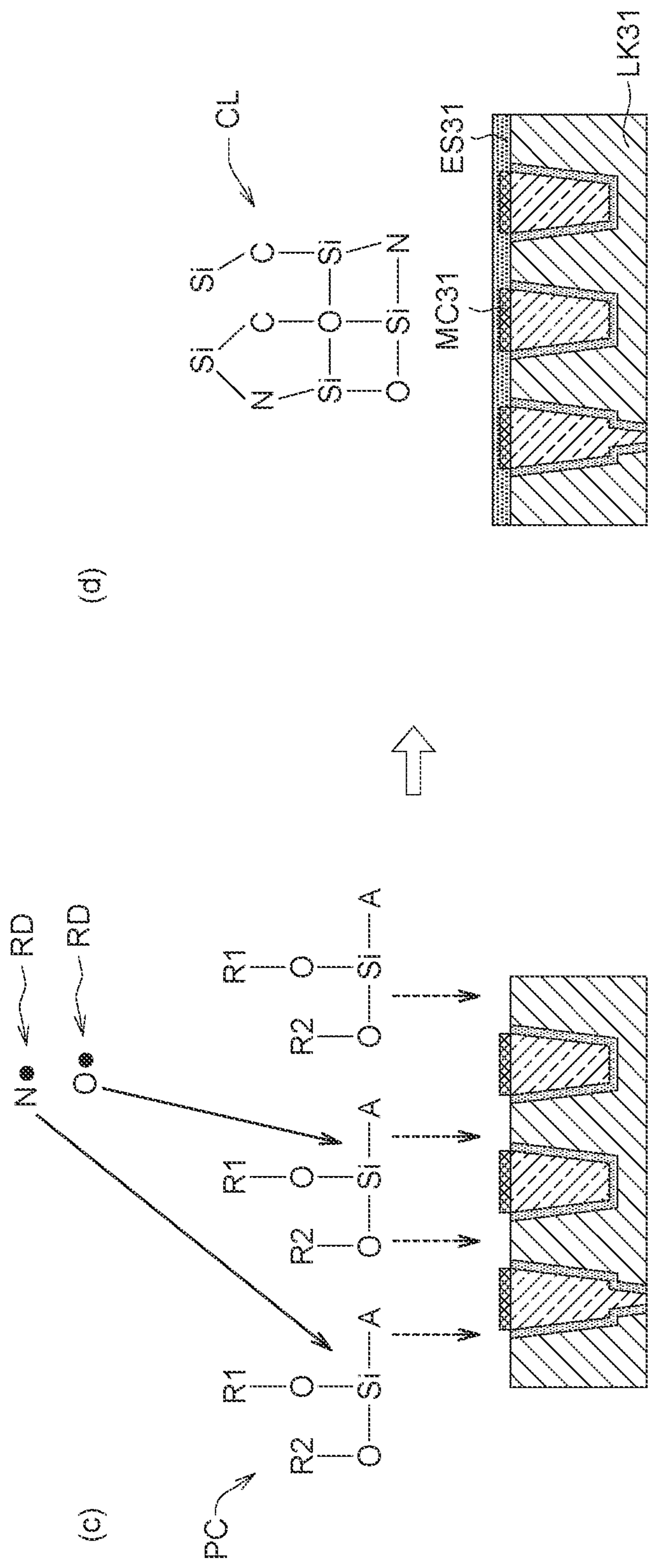
FIG. 7 illustrates the ARCVD process.

Please refer to FIG. 7, which illustrates the ARCVD process. The precursor PC is flowed into the chamber and the reactant radical RD is injected into the precursor PC. Then, the cross-link component CL is formed on the top surface of the metal cap layer MC31 and part of the first low-k layer LK31.

Afterwards, as shown in the drawing (e) of the FIG. 6, the second low-k layer LK32 is formed on the etch stop layer ES31. In this step, the second low-k layer LK32 could be formed, for example, by spin coating, Plasma Enhanced Chemical Vapor Deposition (PECVD), Plasma Enhanced Atomic Layer Deposition (PEALD) or other suitable process. The precursor used for depositing the second low-k layer LK12 could be silane-based material or siloxane-based material with oxygen or non-oxygen process.

Then, as shown in the drawing (f) of the FIG. 6, the concave CV32 is formed in the second low-k layer LK32 and the second barrier layer BR32, the metal via MV31 and the second metal layer MT32 are formed. In this step, the second low-k layer LK32 could be etched by wet etching, dry etching or other suitable process to form the concave CV32.

The second barrier layer BR32 is formed at the lateral surface of the concave CV32 and the top surface of the second low-k layer LK32. The second barrier layer BR32 could be formed, for example, by Chemical Vapor Deposition (CVD), Physical Vapor Deposition (PVD), plating or other suitable processes.

The metal via MV31 is formed on the second barrier layer BR32 and in the concave CV32. The metal via MV31 could be formed, for example, by Electro Chemical Plating (ECP), Electroless Deposition (ELD), Chemical Vapor Deposition (CVD), Physical Vapor Deposition (PVD), plating or other suitable processes.

The second metal layer MT32 is formed on the second barrier layer BR32 and in the concave CV32. The second metal layer MT32 could be formed, for example, by Electro Chemical Plating (ECP), Electroless Deposition (ELD), Chemical Vapor Deposition (CVD), Physical Vapor Deposition (PVD), plating or other suitable processes.

As shown in the drawing (d) of the FIG. 6, because the etch stop layer ES31 is formed by ARCVD, the etch stop layer ES31 could be prevent damage from the plasma deposition used to form any second layer. Therefore, the etch stop layer ES31 could lead to capacitance reduction about 5%.

Figure 8:
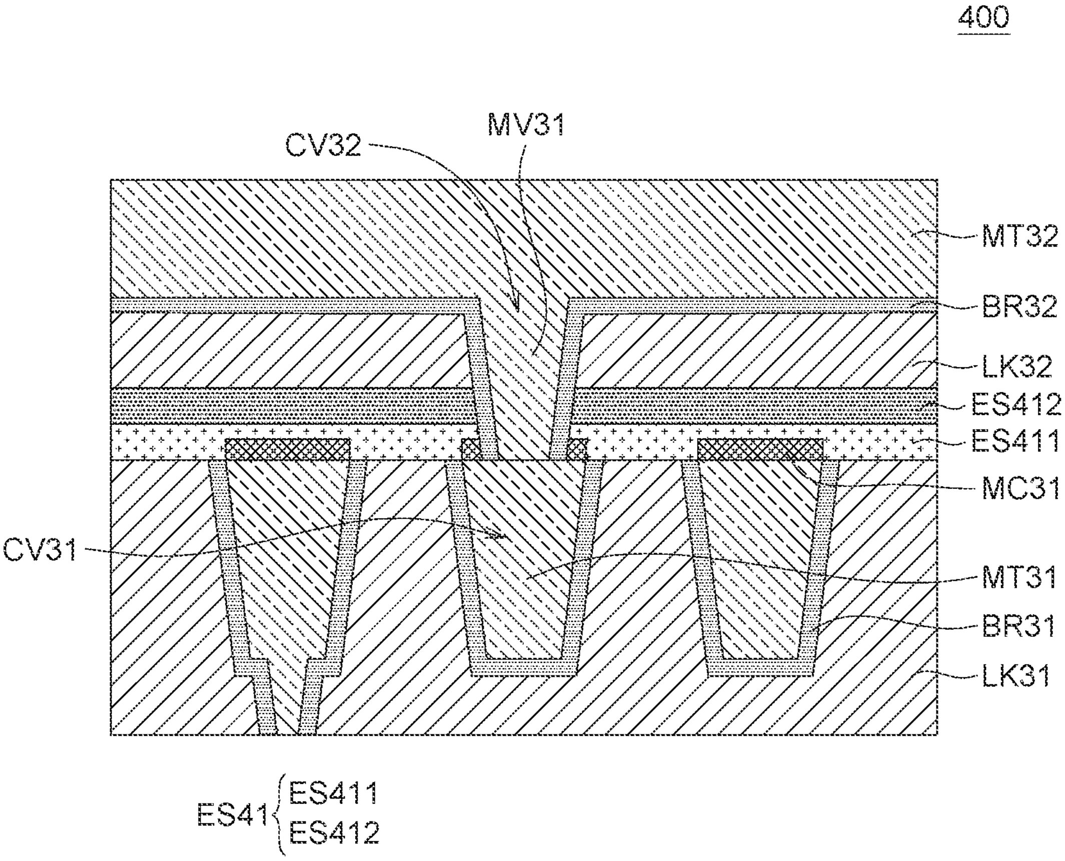
FIG. 8 shows a semiconductor structure according to another embodiment.

Please refer to FIG. 8, which shows a semiconductor structure 400 according to another embodiment. The semiconductor structure 400 is, for example, used to connect the first metal layer (or called Mx metal layer) MT31 and the second metal layer (or called Mx+1 metal layer) MT32 in the back-end-of-line (BEOL) process. The semiconductor structure 400 includes the first low dielectric constant (low-k) layer LK31, the first metal layer MT31, the first barrier layer BR31, the metal cap layer MC31, an etch stop layer (ESL) ES41, the second low-k layer LK32, the second barrier layer BR32, the metal via MV31 and the second metal layer MT32.

The difference between the semiconductor structure 300 and the semiconductor structure 400 is in that the etch stop layer ES41 is a bilayer structure including a first layer ES411 having low-k property and a second layer ES412 having moisture blocking property. The material of the etch stop layer ES41 is, for example, silicon carbon nitride (SiCxNy), boron nitride (BN), boron carbonitride (BCN), silicon oxycarbonitride (SiOCN), silicon oxycarbide (SiOC), the like, or a combination thereof. For example, the material of the first layer ES411 of the etch stop layer ES41 could be silicon carbon nitride (SiCxNy), boron nitride (BN), boron carbonitride (BCN), silicon oxycarbonitride (SiOCN), silicon oxycarbide (SiOC), and the material of the second layer ES412 of the etch stop layer ES41 could be silicon oxycarbide (SiOxCy).

Figure 9:
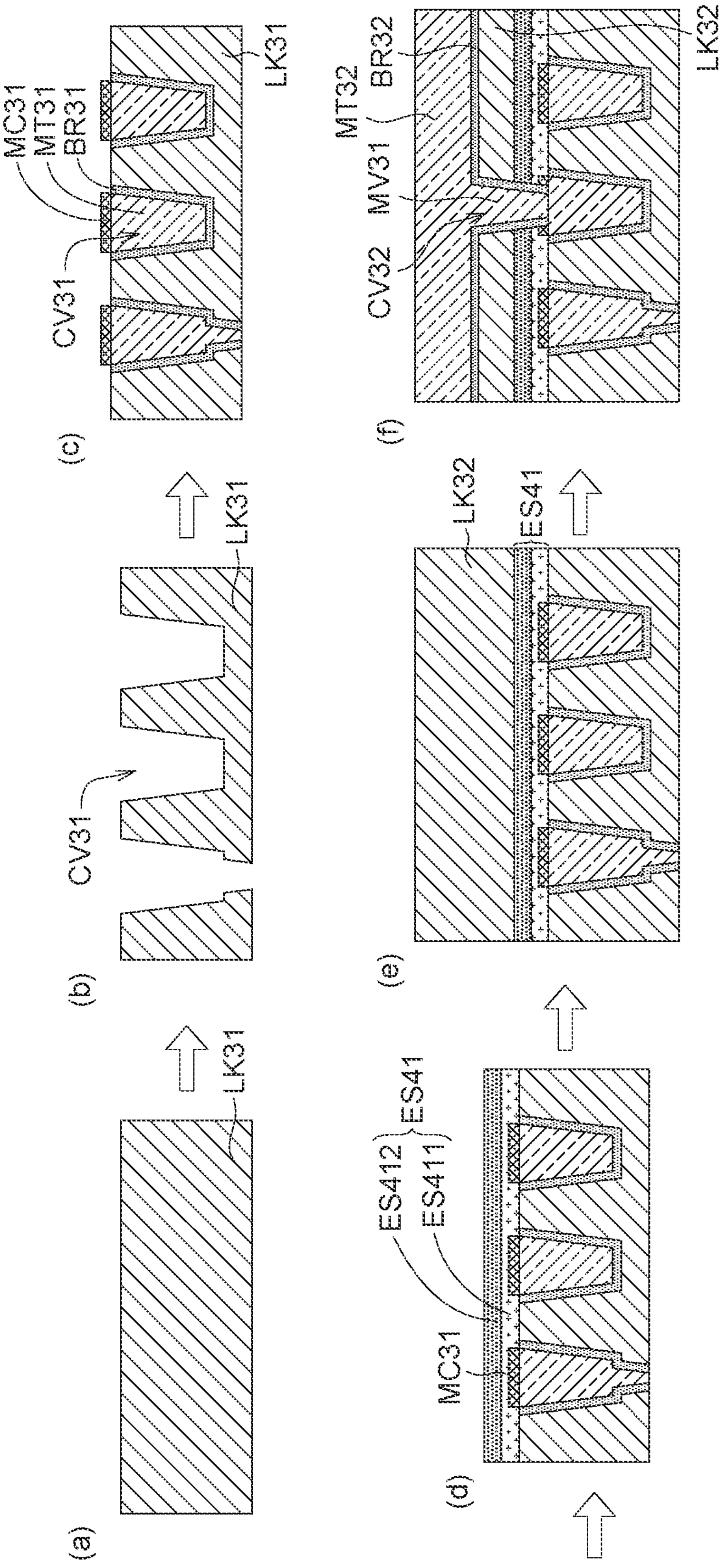
FIG. 9 shows a manufacturing method of the semiconductor structure of FIG. 8 according to one embodiment.

Please refer to FIG. 9, which shows a manufacturing method of the semiconductor structure 400 of FIG. 8 according to one embodiment. The difference between the manufacturing method of the semiconductor structure 400 and the manufacturing method of the semiconductor structure 300 is in the step illustrated in the drawing (d) of the FIG. 9.

As shown in the drawing (d) of the FIG. 9, the etch stop layer ES41 is formed on the metal cap layer MC31 and part of the first low-k layer LK31. In this step, the first layer ES411 of the etch stop layer ES41 is formed, for example, by Plasma Enhanced Chemical Vapor Deposition (PECVD), Plasma Enhanced Atomic Layer Deposition (PEALD), spin coating, remote plasma Chemical Vapor Deposition (CVD), remote plasma Physical Vapor Deposition (PVD) or other suitable process. The first layer ES411 of the etch stop layer ES41 could be, for example, deposited by single precursor with silicon and nitrogen component, such as hexamethyldisilazane (HMDS), or dual precursor with silane and NH3.

The second layer ES412 of the etch stop layer ES41 is formed, for example, by Plasma Enhanced Chemical Vapor Deposition (PECVD), Plasma Enhanced Atomic Layer Deposition (PEALD), thermal Atomic Layer Deposition (ALD) or other suitable process.

Figure 10:
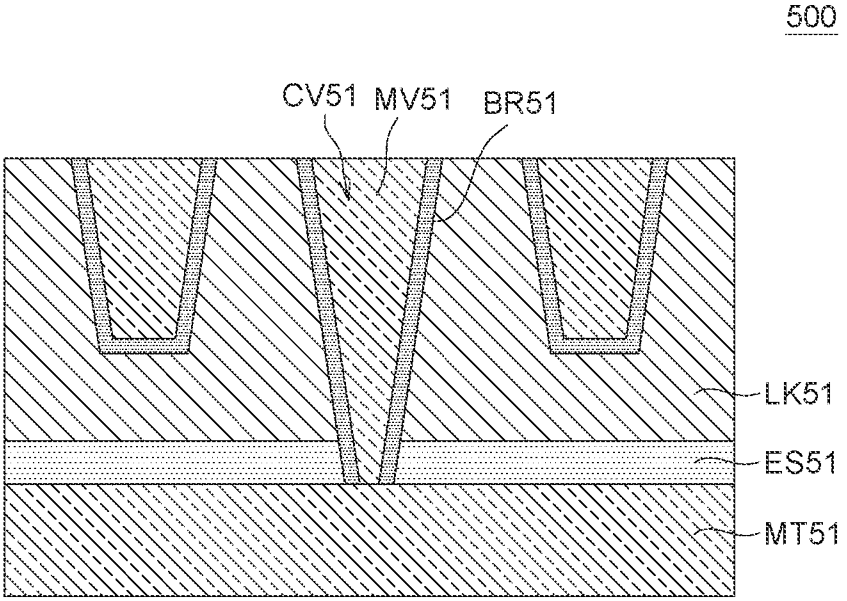
FIG. 10 shows a semiconductor structure according to another embodiment.

Please refer to FIG. 10, which shows a semiconductor structure 500 according to another embodiment. The semiconductor structure 500 includes a metal layer MT51, an etch stop layer (ESL) ES51, a low-k layer LK51, a metal via MV51 and a barrier layer BR51.

The material of the metal layer MT51 is, for example, tungsten (W), ruthenium (Ru), cobalt (Co), copper (Cu), aluminum (Al), nickel (Ni), gold (Au), silver (Ag), gold-aluminum (AuAl), molybdenum (Mo), the like, or a combination thereof.

The etch stop layer (ESL) ES51 is disposed on the metal layer MT51 and expose part of the metal layer MT51. In the embodiment of the FIG. 10, the etch stop layer ES51 is a single-layer structure having low capacitance, low-k and moisture blocking properties. The material of the etch stop layer ES51 is a non-metal based material, such as silicon carbon nitride (SiCxNy), boron nitride (BN), boron carbonitride (BCN), silicon oxycarbonitride (SiOCN), silicon oxycarbide (SiOC), the like, or a combination thereof.

The dielectric constant of the low-k layer LK51 is less than 4. The low-k layer LK51 is disposed on the etch stop layer ES51. The material of the low-k layer LK51 is, for example, silicon oxide (SiO2), silicon oxynitride (SiON), silicon nitride (Si3N4), silicon oxycarbide (SiOC), silicon oxycarbonitride (SiOCN), the like, or a combination thereof.

The metal via MV51 is embodied in the low-k layer LK51 and connected to the metal layer MT51. The low-k layer LK51 has a concave CV51 and the metal via MV51 is disposed in the concave CV51. The material of the metal via MV31 is, for example, tungsten (W), ruthenium (Ru), cobalt (Co), copper (Cu), aluminum (Al), nickel (Ni), gold (Au), silver (Ag), gold-aluminum (AuAl), molybdenum (Mo), the like, or a combination thereof.

The barrier layer BR51 is disposed at a sidewall of the etch stop layer ES51 and a sidewall of the metal via MV51. The barrier layer BR51 is disposed between the metal via MV51 and the low-k layer LK51, between the metal via MV51 and the etch stop layer ES51, and between the metal via MV31 and the metal cap layer MC31. The material of the barrier layer BR51 is, for example, titanium nitride (TiN), tantalum nitride (TaN) or silicon nitride (SiN), the like, or a combination thereof.

In this embodiment, because the material of the etch stop layer ES51 is non-metal based material, the barrier layer BR51 could be continuously disposed at the sidewall of the etch stop layer ES51. As such, the reliability could be improved.

Figure 11:
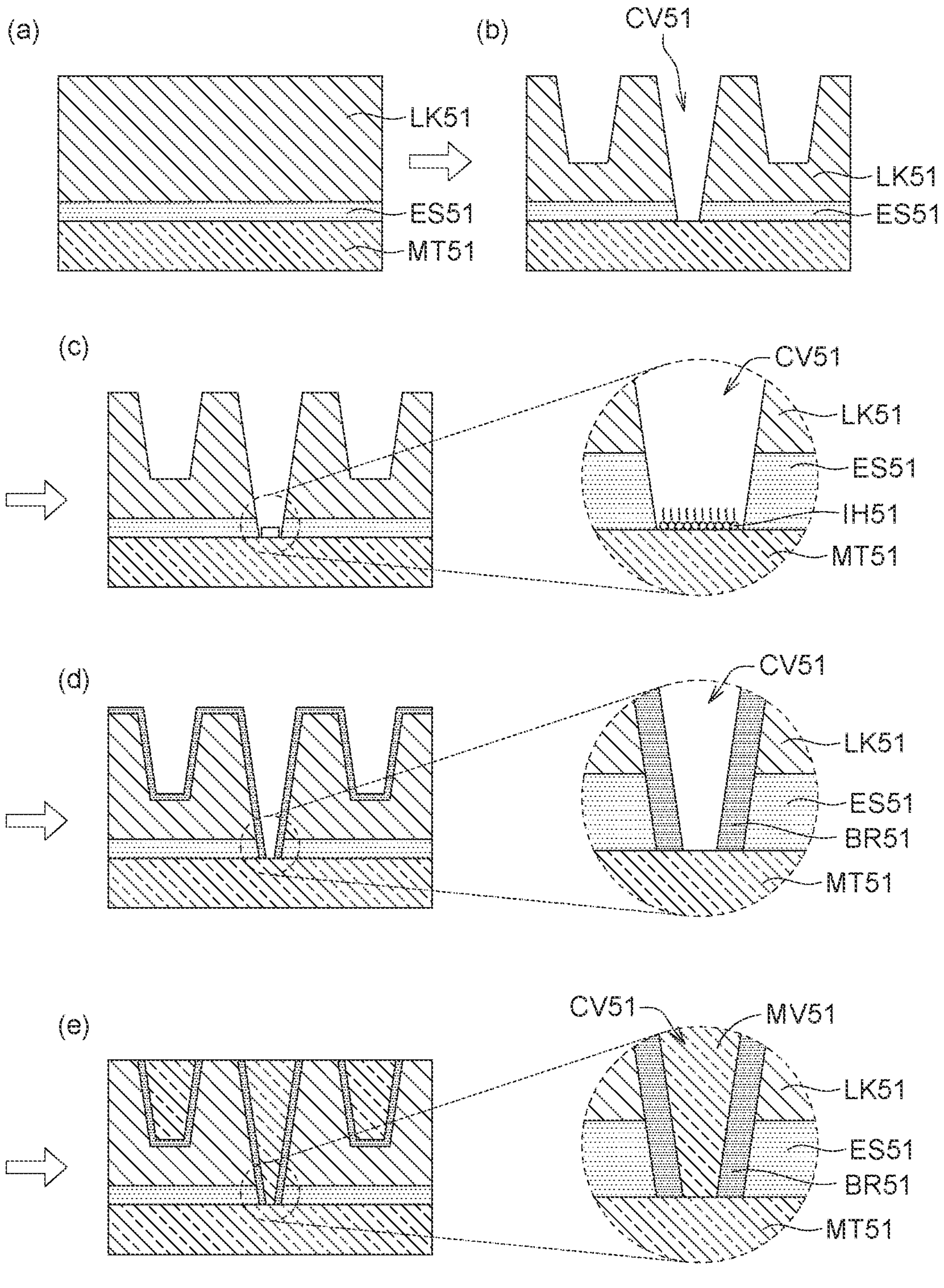
FIG. 11 shows a manufacturing method of the semiconductor structure of FIG. 10 according to one embodiment.

Please refer to FIG. 11, which shows a manufacturing method of the semiconductor structure 500 of FIG. 10 according to one embodiment. As shown in the drawing (a) of the FIG. 11, the metal layer MT51, the etch stop layer ES51 and the low-k layer LK51 are formed. The metal layer MT51 could be formed, for example, by Electro Chemical Plating (ECP), Electroless Deposition (ELD), Chemical Vapor Deposition (CVD), Physical Vapor Deposition (PVD), plating or other suitable processes.

The etch stop layer ES51 is formed on the metal layer MT51. In this step, the etch stop layer ES51 is formed, for example, by ALD like radical CVD (ARCVD) or other suitable process. The etch stop layer ES51 could be, for example, deposited by single precursor with silicon and nitrogen component, such as hexamethyldisilazane (HMDS), or dual precursor with silane and NH3.

The low-k layer LK51 could be formed, for example, by spin coating, Plasma Enhanced Chemical Vapor Deposition (PECVD), Plasma Enhanced Atomic Layer Deposition (PEALD) or other suitable process. The precursor used for depositing the low-k layer LK51 could be silane-based material or siloxane-based material with oxygen or non-oxygen process.

Then, as shown in the drawing (b) of the FIG. 11, a concave CV51 is formed in the low-k layer LK51 and the etch stop layer ES51 to expose part of the metal layer MT51. In this step, the low-k layer LK51 and the etch stop layer ES51 could be etched by wet etching, dry etching or other suitable process.

Next, as shown in the drawing (c) of the FIG. 11, an inhibitor layer IH51 is formed on the exposed surface of the metal layer MT51. Because the materials of the etch stop layer ES51 and low-k layer LK51 are non-metal based material. The inhibitor layer IH51 only covers the metal layer MT51, and does not cover the etch stop layer ES51 and the low-k layer LK51. The material of the inhibitor layer IH51 is thiol (—SH) material, phosphonic acid (—POOH) material, benzoate self assembly monolayer (SAM) and other specific functional group that could attach to metal but not on the low-k material. In this step, the inhibitor layer IH51 could be formed, for example, by Chemical Vapor Deposition (CVD), spin coating, spraying, or dip coating.

Afterwards, as shown in the drawing (d) of the FIG. 11, the barrier layer BR51 is formed at the lateral surface of the low-k layer LK51 and the lateral surface of the second low-k layer LK51 and in the concave CV51. The barrier layer BR51 could be formed, for example, by Chemical Vapor Deposition (CVD), Physical Vapor Deposition (PVD), plating or other suitable processes.

Then, as shown in the drawing (e) of the FIG. 11, the metal via MV51 is formed on the barrier layer BR51 and in the concave CV51. The metal via MV51 could be formed, for example, by Electro Chemical Plating (ECP), Electroless Deposition (ELD), Chemical Vapor Deposition (CVD), Physical Vapor Deposition (PVD), plating or other suitable processes.

In this embodiment, as shown in the drawing (d) of the FIG. 11, because the material of the etch stop layer ES51 is non-metal based material, the inhibitor layer IH51 does not cover the etch stop layer ES51, and the barrier layer BR51 could be continuously disposed at the sidewall of the etch stop layer ES51. As such, the reliability could be improved.

Figure 12:
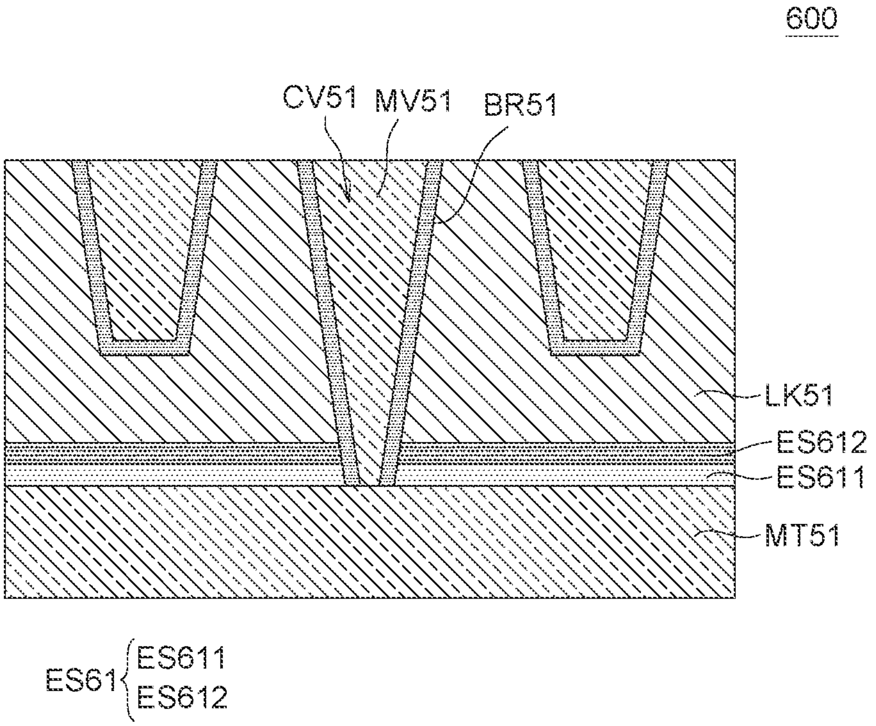
FIG. 12 shows a semiconductor structure according to another embodiment.

Please refer to FIG. 12, which shows a semiconductor structure 600 according to another embodiment. The semiconductor structure 600 includes the metal layer MT51, an etch stop layer (ESL) ES61, the low-k layer LK51, the metal via MV51 and the barrier layer BR51.

The difference between the semiconductor structure 600 and the semiconductor structure 500 is in that the etch stop layer ES61 is a bilayer structure including a first layer ES611 having low-k property and a second layer ES612 having moisture blocking property. The material of the etch stop layer ES61 is, for example, silicon carbon nitride (SiCxNy), boron nitride (BN), boron carbonitride (BCN), silicon oxycarbonitride (SiOCN), silicon oxycarbide (SiOC), the like, or a combination thereof. For example, the material of the first layer ES611 of the etch stop layer ES61 could be silicon carbon nitride (SiCxNy), boron nitride (BN), boron carbonitride (BCN), silicon oxycarbonitride (SiOCN), silicon oxycarbide (SiOC), and the material of the second layer ES612 of the etch stop layer ES61 could be silicon oxycarbide (SiOxCy).

Figure 13:
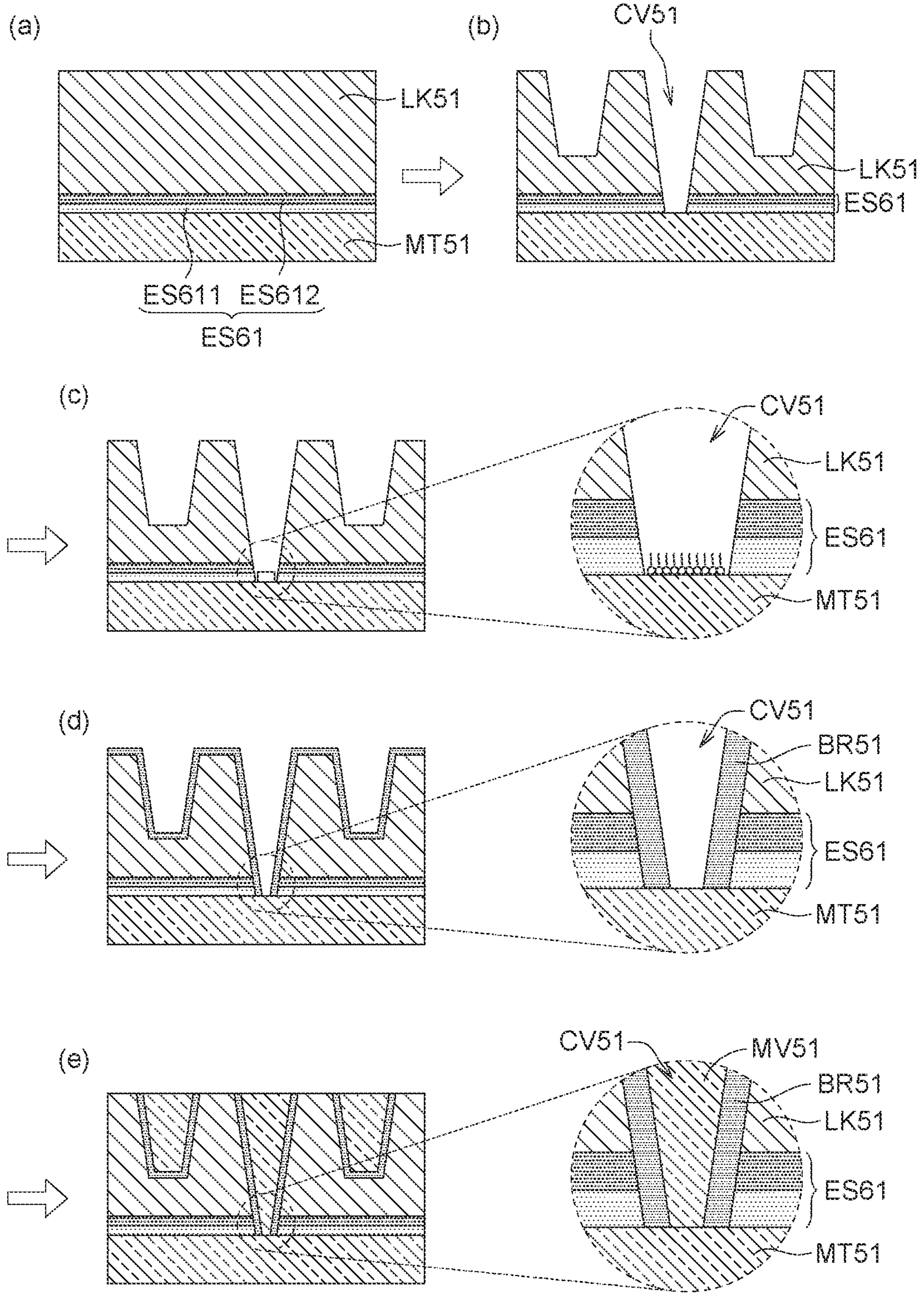
FIG. 13 shows a manufacturing method of the semiconductor structure of FIG. 12 according to one embodiment.

Please refer to FIG. 13, which shows a manufacturing method of the semiconductor structure 600 of FIG. 12 according to one embodiment. The difference between the manufacturing method of the semiconductor structure 600 and the manufacturing method of the semiconductor structure 500 is in the step illustrated in the drawing (a) of the FIG. 13.

As shown in the drawing (a) of the FIG. 13, the etch stop layer ES61 is formed on the metal layer MT61. In this step, the first layer ES611 of the etch stop layer ES61 is formed, for example, by Plasma Enhanced Chemical Vapor Deposition (PECVD), Plasma Enhanced Atomic Layer Deposition (PEALD), spin coating, remote plasma Chemical Vapor Deposition (CVD), remote plasma Physical Vapor Deposition (PVD) or other suitable process. The first layer ES611 of the etch stop layer ES61 could be, for example, deposited by single precursor with silicon and nitrogen component, such as hexamethyldisilazane (HMDS), or dual precursor with silane and NH3.

The second layer ES612 of the etch stop layer ES61 is formed, for example, by Plasma Enhanced Chemical Vapor Deposition (PECVD), Plasma Enhanced Atomic Layer Deposition (PEALD), thermal Atomic Layer Deposition (ALD) or other suitable process.

According to some of the embodiments described above, the DoD layer DO11 is used to prevent punch caused by metal via MV11 landing misalignment. The punch will lead to line to line leakage fail, voltage breakdown (Vbd) and worse Time Dependent Dielectric Breakdown (TDDB).

Further, according to some of the embodiments described above, the etch stop layers ES11, ES31, ES51 are the single-layer structures having low capacitance, low-k and moisture blocking properties, so the etch stop layers ES11, ES31, ES51 could be prevent damage from the plasma deposition used to form the second layer. Therefore, the etch stop layers ES11, ES31, ES51 could lead to capacitance reduction about 5%.

Moreover, according to some of the embodiments described above, the material of the etch stop layer ES51 is non-metal based material, the barrier layer BR51 could be continuously disposed at the sidewall of the etch stop layer ES51. As such, the reliability could be improved.

According to one embodiment, a semiconductor structure is provided. The semiconductor structure includes a first low dielectric constant (low-k) layer, a first metal layer, a metal cap layer, a dielectric on dielectric (DoD) layer, an etch stop layer (ESL), a second low-k layer, a metal via and a second metal layer. The dielectric constant of the first low dielectric constant (low-k) layer is less than 4. The first metal layer is embodied in the first low-k layer. The first low-k layer exposes the first metal layer. The metal cap layer is disposed on the first metal layer. The dielectric on dielectric (DoD) layer is disposed on the first low-k layer. The etch stop layer (ESL) is disposed on the metal cap layer and the DoD layer. The second low-k layer is disposed above the etch stop layer. The metal via is embodied in the second low-k layer and connected to the first metal layer. The second metal layer is disposed above the second low-k layer and connected to the metal via.

According to one embodiment based on the previously presented embodiment, a material of the DoD layer is aluminum nitride (AlN), aluminum oxynitride (AlON), aluminum oxide (AlO), silicon oxide (SiO), or aluminum oxycarbide (AlOC).

According to one embodiment based on the previously presented embodiment, a thickness of the DoD layer is less than 15 Å.

According to one embodiment based on the previously presented embodiment, the DoD layer is deposited by thermal atomic layer deposition (ALD) process.

According to one embodiment based on the previously presented embodiment, a thickness of the DoD layer is larger than a thickness of the metal cap layer.

According to one embodiment based on the previously presented embodiment, the DoD layer is 2 to 5 times thicker than the metal cap layer.

According to one embodiment based on the previously presented embodiment, the etch stop layer is a bilayer structure.

According to another embodiment, a semiconductor structure. The semiconductor structure includes a first low dielectric constant (low-k) layer, a first metal layer, a metal cap layer, an etch stop layer (ESL), a second low-k layer, a metal via and a second metal layer. The dielectric constant of the first low dielectric constant (low-k) layer is less than 4. The first metal layer is embodied in the first low-k layer. The first low-k layer exposes the first metal layer. The metal cap layer is disposed on the first metal layer. The etch stop layer (ESL) is disposed on the metal cap layer and the first low-k layer. The etch stop layer is a single layer structure. The second low-k layer is disposed above the etch stop layer. The metal via is embodied in the second low-k layer and connected to the first metal layer. The second metal layer is disposed above the second low-k layer and connected to the metal via.

According to one embodiment based on the previously presented embodiment, a material of the etch stop layer is silicon carbon nitride (SiCN), boron nitride (BN), boron carbon nitride (BCN), carbon- and nitride-doped silicon oxide (SiCON), or silicon oxycarbide (SiOC).

According to one embodiment based on the previously presented embodiment, the etch stop layer is deposited by an ALD like radical CVD (ARCVD) process.

According to one embodiment based on the previously presented embodiment, the etch stop layer is deposited by single precursor with silicon (Si) and nitrogen (N).

According to one embodiment based on the previously presented embodiment, the precursor is hexamethyldisilazane (HMDS).

According to an alternative embodiment, a semiconductor structure is provided. The semiconductor structure includes a metal layer, an etch stop layer (ESL), a low-k layer, a metal via and a barrier layer. The etch stop layer (ESL) is disposed on the metal layer and expose part of the metal layer. A material of the etch stop layer is a non-metal based material. The low-k layer is disposed on the etch stop layer. The metal via is embodied in the low-k layer and connected to the metal layer. The barrier layer is disposed at a sidewall of the etch stop layer and a sidewall of the metal via.

According to one embodiment based on the previously presented embodiment, a material of the etch stop layer is silicon carbon nitride (SiCN), boron nitride (BN), boron carbon nitride (BCN), carbon- and nitride-doped silicon oxide (SiCON), or silicon oxycarbide (SiOC).

According to one embodiment based on the previously presented embodiment, the etch stop layer is deposited by a plasma-enhanced chemical vapor deposition (PECVD) process, a plasma-enhanced atomic layer deposition (PEALD) process, a spin coating, a remote plasma chemical vapor deposition (remote plasma CVD) process, or a physical vapor deposition (PVD) process.

According to one embodiment based on the previously presented embodiment, the etch stop layer is deposited by single precursor with silicon (Si) and nitrogen (N).

According to one embodiment based on the previously presented embodiment, the precursor is hexamethyldisilazane (HMDS).

According to one embodiment based on the previously presented embodiment, the etch stop layer is deposited by dual precursor.

According to one embodiment based on the previously presented embodiment, the dual precursor is silane and Ammonia (NH3).

According to one embodiment based on the previously presented embodiment, the etch stop layer is a bilayer structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
- a first low dielectric constant (low-k) layer, having a dielectric constant less than 4;
- a first metal layer, embedded in the first low-k layer, wherein the first low-k layer exposes the first metal layer;
- a metal cap layer, disposed on the first metal layer;
- a dielectric on dielectric (DoD) layer, disposed on the first low-k layer;
- an etch stop layer (ESL), disposed on the metal cap layer and the DoD layer;
- a second low-k layer, disposed above the etch stop layer;
- a metal via, embedded in the second low-k layer and connected to the first metal layer; and
- a second metal layer, disposed above the second low-k layer and connected to the metal via;
- wherein the DoD layer comprises a top surface along a first direction and a lateral surface along a second direction different from the first direction and the etch stop layer covers both of the top surface and the lateral surface of the DoD layer.

2. The semiconductor structure according to claim 1, wherein a material of the DoD layer is aluminum nitride (AlN), aluminum oxynitride (AlON), aluminum oxide ($Al_2O_3$), silicon oxide (SiO), or aluminum oxycarbide (AlOC).

3. The semiconductor structure according to claim 1, wherein a thickness of the DoD layer is less than 15 Å.

4. The semiconductor structure according to claim 1, wherein the DoD layer is deposited by a thermal atomic layer deposition (ALD) process.

5. The semiconductor structure according to claim 1, wherein a thickness of the DoD layer is larger than a thickness of the metal cap layer.

6. The semiconductor structure according to claim 1, wherein the DoD layer is 2 to 5 times thicker than the metal cap layer.

7. The semiconductor structure according to claim 1, wherein the etch stop layer is a bilayer structure.

8. A semiconductor structure, comprising:
- a first low dielectric constant (low-k) layer, having a dielectric constant less than 4;
- a first metal layer, embedded in the first low-k layer, wherein the first low-k layer exposes the first metal layer;
- a metal cap layer, disposed on the first metal layer;
- an etch stop layer (ESL), disposed on the metal cap layer and the first low-k layer, wherein the etch stop layer is a single layer structure;
- a second low-k layer, disposed above the etch stop layer;
- a metal via, embedded in the second low-k layer and connected to the first metal layer; and
- a second metal layer, disposed above the second low-k layer and connected to the metal via;

wherein the metal cap layer comprises a top surface along a first direction and a lateral surface along a second direction different from the first direction and the etch stop layer covers both of the top surface and the lateral surface of the metal cap layer.

9. The semiconductor structure according to claim 8, wherein a material of the etch stop layer is silicon carbon nitride (SiCN), boron nitride (BN), boron carbon nitride (BCN), carbon- and nitride-doped silicon oxide (SiCON), or silicon oxycarbide (SiOC).

10. The semiconductor structure according to claim 8, wherein the etch stop layer is deposited by an ARCVD process.

11. The semiconductor structure according to claim 8, wherein the etch stop layer is deposited using a single precursor comprising silicon (Si) and nitrogen (N).

12. The semiconductor structure according to claim 10, wherein the precursor is hexamethyldisilazane (HMDS).

13. A semiconductor structure, comprising:

a metal layer;

an etch stop layer (ESL), disposed on the metal layer and exposing part of the metal layer, wherein a material of the etch stop layer is a non-metal based material;

a low-k layer, disposed on the etch stop layer;

a metal via, embedded in the low-k layer and connected to the metal layer; and a barrier layer, disposed on a sidewall of the etch stop layer and a sidewall of the metal via;

wherein the etch stop layer comprises a first portion and a second portion, and the barrier layer is disposed between the first portion and the second portion.

14. The semiconductor structure according to claim 13, wherein a material of the etch stop layer is silicon carbon nitride (SiCN), boron nitride (BN), boron carbon nitride (BCN), carbon- and nitride-doped silicon oxide (SiCON), or silicon oxycarbide (SiOC).

15. The semiconductor structure according to claim 13, wherein the etch stop layer is deposited by a plasma-enhanced chemical vapor deposition (PECVD) process, a plasma-enhanced atomic layer deposition (PEALD) process, a spin coating process, a remote plasma chemical vapor deposition (remote plasma CVD) process, or a physical vapor deposition (PVD) process.

16. The semiconductor structure according to claim 13, wherein the etch stop layer is deposited using a single precursor comprising silicon (Si) and nitrogen (N).

17. The semiconductor structure according to claim 16, wherein the precursor is hexamethyldisilazane (HMDS).

18. The semiconductor structure according to claim 13, wherein the etch stop layer is deposited using dual precursors.

19. The semiconductor structure according to claim 18, wherein the dual precursors are silane and ammonia (NH3).

20. The semiconductor structure according to claim 13, wherein the etch stop layer is a bilayer structure.

* * * * *